(12) United States Patent
Jung

(10) Patent No.: US 7,326,876 B2
(45) Date of Patent: Feb. 5, 2008

(54) SEQUENTIAL LATERAL SOLIDIFICATION DEVICE

(75) Inventor: Yun Ho Jung, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/872,478

(22) Filed: Jun. 22, 2004

(65) Prior Publication Data

US 2004/0262272 A1    Dec. 30, 2004

(30) Foreign Application Priority Data

Jun. 30, 2003 (KR) ................ 10-2003-0043647

(51) Int. Cl.
*B23K 26/00* (2006.01)
*H01L 21/324* (2006.01)

(52) U.S. Cl. .................. 219/121.61; 219/121.65; 438/487; 438/795

(58) Field of Classification Search ........... 219/121.65, 219/121.66, 121.61, 121.62; 438/487, 795
See application file for complete search history.

(56) References Cited

U.S. PATENT DOCUMENTS

| | | | | |
|---|---|---|---|---|
| 4,128,752 A | * | 12/1978 | Gravel | 219/121.68 |
| 4,234,356 A | * | 11/1980 | Auston et al. | 438/799 |
| 4,302,673 A | * | 11/1981 | Bly | 250/332 |
| 4,765,715 A | * | 8/1988 | Matsudaira et al. | 359/583 |
| 4,922,290 A | * | 5/1990 | Yoshitake et al. | 355/53 |
| 5,367,514 A | * | 11/1994 | Kobayashi et al. | 369/47.51 |
| 5,381,210 A | | 1/1995 | Hagiwara | |
| 5,442,651 A | * | 8/1995 | Maeda | 372/97 |
| 5,590,148 A | * | 12/1996 | Szarmes | 372/105 |
| 5,631,734 A | * | 5/1997 | Stern et al. | 356/317 |
| 5,790,503 A | * | 8/1998 | Mizuno et al. | 369/112.19 |
| 5,986,807 A | * | 11/1999 | Fork | 359/569 |
| 6,076,932 A | * | 6/2000 | Uchida et al. | 359/614 |
| 6,122,058 A | * | 9/2000 | Van Der Werf et al. | 356/635 |
| 6,270,222 B1 | * | 8/2001 | Herpst | 359/511 |
| 6,322,625 B2 | * | 11/2001 | Im | 117/43 |
| 6,458,253 B2 | * | 10/2002 | Ando et al. | 204/192.15 |
| 6,498,353 B2 | * | 12/2002 | Nagle et al. | 250/573 |
| 6,621,044 B2 | * | 9/2003 | Jain et al. | 219/121.7 |
| 6,664,950 B1 | * | 12/2003 | Blanchard | 345/173 |
| 6,693,930 B1 | * | 2/2004 | Chuang et al. | 372/29.021 |
| 6,861,614 B1 | * | 3/2005 | Tanabe et al. | 219/121.66 |
| 6,987,240 B2 | * | 1/2006 | Jennings et al. | 219/121.8 |
| 2002/0044346 A1 | * | 4/2002 | Nguyen et al. | 359/368 |
| 2002/0123066 A1 | * | 9/2002 | Erikson | 435/6 |

(Continued)

FOREIGN PATENT DOCUMENTS

JP    359220634 A    * 12/1984

(Continued)

*Primary Examiner*—Samuel M. Heinrich
(74) *Attorney, Agent, or Firm*—McKenna, Long & Aldridge LLP

(57) ABSTRACT

A sequential lateral solidification device, for enhancing optical characteristics of the device and for preventing damage caused by an ablation of a crystallization thin film, is disclosed. The device includes a laser light source generating a laser beam, a projection lens focusing the laser beam generated from the laser light source onto a substrate, a laser beam splitter between the projection lens and the substrate that passes the laser beam generated from the laser light source to irradiate the substrate and that blocks the laser beam reflected back from the substrate towards the projection lens, and a stage having the substrate mounted thereon.

5 Claims, 8 Drawing Sheets

U.S. PATENT DOCUMENTS

| | | | |
|---|---|---|---|
| 2003/0011772 A1* | 1/2003 | Abe et al. | 356/417 |
| 2003/0057418 A1* | 3/2003 | Asano | 257/66 |
| 2003/0059990 A1* | 3/2003 | Yamazaki | 438/166 |
| 2003/0089690 A1* | 5/2003 | Yamazaki et al. | 219/121.66 |
| 2003/0185137 A1* | 10/2003 | Horinouchi et al. | 369/112.22 |
| 2004/0012775 A1* | 1/2004 | Kinney et al. | 356/237.2 |
| 2004/0041158 A1* | 3/2004 | Hongo et al. | 257/79 |
| 2004/0105096 A1* | 6/2004 | Takami | 356/369 |
| 2004/0196453 A1* | 10/2004 | Some | 356/237.1 |
| 2004/0241340 A1* | 12/2004 | Sato et al. | 427/553 |
| 2004/0256552 A1* | 12/2004 | Kawakatsu | 250/306 |
| 2004/0262275 A1* | 12/2004 | Kuroiwa et al. | 219/121.77 |

FOREIGN PATENT DOCUMENTS

| | | | |
|---|---|---|---|
| JP | 402046986 A | * | 2/1990 |
| JP | 402220009 A | * | 9/1990 |
| JP | 02002214759 A | * | 7/2002 |

\* cited by examiner

SEQUENTIAL LATERAL SOLIDIFICATION DEVICE

This application claims the benefit of Korean Application No. P2003-043647, filed on Jun. 30, 2003, which is hereby incorporated by reference as if fully set forth herein.

BACKGROUND OF THE INVENTION

1. Field of the Invention

The present invention relates to a silicon solidification device, and more particularly, to a sequential lateral solidification device. Although the present invention is suitable for a wide scope of applications, it is particularly suitable for improving optical characteristics of the sequential lateral solidification device and preventing optical damage caused by ablation of the crystallization thin film.

2. Discussion of the Related Art

As information technologies develop, various displays are in demand. Recently, many efforts have been made to research and develop various flat display panels such as a liquid crystal display device (LCD), a plasma display panel (PDP), an electroluminescent display (ELD), a vacuum fluorescent display (VFD), and the like. Some types of the flat display panels have already been used in various display devices.

LCDs are widely used because of the beneficial characteristics and advantages including high quality images, light weight, thin and compact size, and low power consumption so as to be used as a substitute for cathode ray tubes (CRT) for mobile image display devices. LCDs have also been developed to be used in devices receiving and displaying broadcast signals, such as a television, a computer monitor, and the like.

Even if there are significant developments in the LCD technology for an image display in various fields, the image quality fails to meet the characteristics and advantages of an LCD.

In order to apply a liquid crystal display device as a display device in various fields, development of an LCD depends on realizing image qualities, such as high resolution, high brightness, wide screen, and the like, as well as maintaining the characteristics of lightness, compactness, and low power consumption.

Such a liquid crystal display device includes a liquid crystal display panel displaying an image and a driving unit for applying driving signals to the liquid crystal panel. The liquid crystal display panel includes first and second substrates bonded to each other and a liquid crystal layer injected between the first and second substrates.

In this case, on the first glass substrate (TFT array substrate), a plurality of gate lines are formed to be arranged in one direction at an interval from one another, a plurality of data lines arranged in a direction substantially perpendicular to the gate lines at an interval from one another, a plurality of pixel electrodes formed in pixel areas in a matrix defined by the gate and data lines crossing one another, and a plurality of thin film transistors switched by signals of the gate lines to transfer signals of the data lines to the pixel electrodes.

On the second glass substrate (color filter substrate), a black matrix layer for shielding light from outside the pixel areas, an R/G/B color filter layer for realizing colors, and a common electrode for realizing an image are formed. The common electrode is formed on the first substrate in a horizontal electric field type LCD.

The above-described first and second substrates are separated from each other by spacers to provide a space, and are bonded to each other through a sealant having a liquid crystal injection inlet. Further, liquid crystal is injected between the two substrates.

The liquid crystal injection method is carried out by maintaining a vacuum state within the gap between the two substrates bonded by the sealant. Then, the liquid crystal injection inlet is dipped in a vessel containing liquid crystal, so as to allow the liquid crystal to be injected into the gap between the two substrates by osmosis. When the liquid crystal is injected as described above, the liquid crystal injection inlet is sealed with an air-tight sealant.

The driving principle of a general liquid crystal display device uses the optical anisotropy and polarization characteristic of liquid crystal. Because the structure of liquid crystal is thin and long, the liquid crystal molecules are aligned to have a specific direction. Also, the direction of the alignment can be controlled by applying an artificial electric field to the liquid crystals. Therefore, when the alignment of the liquid crystal molecules is arbitrarily controlled, the alignment of the liquid crystal molecules is eventually altered. Subsequently, due to the optical anisotropy of liquid crystals, light rays are refracted in the direction of the alignment of the liquid crystal molecules, thereby representing image information.

In recent technologies, the active matrix liquid crystal display (LCD), which is formed of a thin film transistor and pixel electrodes aligned in a matrix form and connected to the thin film transistor, is considered to be excellent for its high resolution and its ability to represent animated images.

A polycrystalline silicon, having a high electric field mobility and low photocurrent, is typically used to form a semiconductor layer for the above-described thin film transistor. The method for fabricating a polycrystalline silicon can be divided into a low temperature fabrication process and a high temperature fabrication process depending upon the fabrication temperature.

The high temperature fabrication process requires a temperature condition of approximately 1000° C., which is equal to or higher than the temperature for modifying substrates. Because glass substrates have poor heat-resistance, expensive quartz substrates having excellent heat-resistance should be used. When fabricating a polycrystalline silicon thin film using the high temperature fabrication process, inadequate crystallization may occur due to high surface roughness and fine crystal grains, thereby resulting in poor device characteristics, as compared to the polycrystalline silicon formed by the low temperature fabrication process. Therefore, technologies for crystallizing amorphous silicon, that can be vapor-deposited at a low temperature, to form polycrystalline silicon are being researched and developed.

The low temperature fabrication process can be categorized into laser annealing and metal induced crystallization processes.

The laser annealing process includes irradiating a pulsed laser beam on a substrate. More specifically, by using the pulsed laser beam, the solidification and condensation of the substrate can be repeated about every 10 to 100 nanoseconds. The low temperature fabrication process is acknowledged as having the advantage that the damage caused on a lower insulating substrate can be minimized.

The related art crystallization method of silicon using the laser annealing method will now be explained in detail.

FIG. 1 illustrates a graph showing the size of amorphous silicon particles versus laser energy density.

As shown in FIG. 1, the crystallization of the amorphous silicon can be separated into a first region, a second region, and a third region depending upon the intensity of a laser energy.

The first region is a partial melting region, whereby the intensity of the laser energy irradiated on the amorphous silicon layer melts only the surface of the amorphous silicon layer. After irradiation, the surface of the amorphous silicon layer is partially melted in the first region, whereby small crystal grains are formed on the surface of the amorphous silicon layer after a solidification process.

The second region is a near-to-complete melting region, whereby the intensity of the laser energy, being higher than that of the first region, almost completely melts the amorphous silicon. After the melting, the remaining nuclei are used as seeds for crystal growth, thereby forming crystal particles with increased crystal growth as compared to the first region. However, the crystal particles formed in the second region are not uniform. The second region is narrower than the first region.

The third region is a complete melting region, whereby laser energy with an increased intensity, as compared to that of the second region, is irradiated to completely melt the amorphous silicon layer. After the complete melting of the amorphous silicon layer, a solidification process is carried out, so as to allow a homogenous nucleation, thereby forming a crystal silicon layer formed of fine and uniform crystal particles.

In this method of fabricating a polycrystalline silicon, the number of laser beam irradiations and a degree of overlap are controlled in order to form uniform and large and rough crystal particles by using the energy density of the second region.

However, the interfaces between the plurality of polycrystalline silicon crystal particles act as obstacles to the electric current flow, thereby decreasing the reliability of the thin film transistor device. In addition, collision between electrons may occur within the plurality of crystal particles causing damage to an insulating layer due to the collision current and deterioration, thereby resulting in product degradation or defects. In order to resolve such problems in the method for fabricating a polycrystalline silicon using a sequential lateral solidification (SLS) crystallization method, the crystal growth of the silicon crystal particle occurs at an interface between liquid silicon and solid silicon in a direction perpendicular to the interface. The SLS crystallizing method is disclosed in detail by Robert S. Sposilli, M. A. Crowder, and James S. Im, Mat. Res. Soc. Symp. Proc. Vol. 452, pp. 956-957, 1997.

In the SLS crystallizing method, the amount of laser energy, the irradiation range of the laser beam, and the translation distance are controlled, so as to allow a lateral growth of the silicon crystal particle with a predetermined length, thereby crystallizing the amorphous silicon into a single crystal.

The irradiation device used in the SLS crystallizing method concentrates the laser beam into a small and narrow region, and so the amorphous silicon layer deposited on the substrate cannot all be changed into polycrystalline with a single irradiation. Therefore, in order to change the irradiation position on the substrate, the substrate having the amorphous silicon layer deposited thereon is mounted on a stage. Then, after an irradiation on a predetermined area, the substrate is moved so as to allow an irradiation to be performed on another area, thereby carrying out the irradiation process on the entire surface of the substrate.

FIG. 2 illustrates a cross-sectional view showing a related art laser heat treatment process.

Referring to FIG. 2, first a buffer layer 21 and then an amorphous silicon layer 22 are formed on a substrate 20. Then, a laser beam pattern mask (not shown) with sequentially alternating transparent parts and opaque parts is placed over the substrate 20 having the amorphous silicon layer 22 deposited thereon. Thereafter, the laser irradiation process is performed on the amorphous silicon layer 22.

The amorphous silicon layer 22 is generally deposited on the substrate 20 by a chemical vapor deposition (CVD) method, which results in a high content of hydrogen within the amorphous silicon layer 22 immediately after the deposition. However, when the thin film is heated hydrogen tends to escape from the thin film. Therefore, a primary heat treatment is carried out on the amorphous silicon layer 22 in order to perform a dehydrogenation process. When the hydrogen is not eliminated prior to crystallization, the surface of the crystallized silicon layer becomes rough, thereby resulting in a poor electrical characteristic.

FIG. 3 illustrates a plan view of a substrate having a portion thereof crystallized.

As shown in FIG. 3, a single shot of laser beam is irradiated through the laser beam pattern mask (not shown) placed over the amorphous silicon layer 22. The irradiated laser beam passes through the plurality of transparent parts 'A' formed on the laser beam pattern mask. The laser beam then melts and liquidizes the amorphous silicon layer 22. The intensity of the laser energy used herein has a value selected from the complete melting region (as shown in FIG. 1), whereby the silicon layer is completely melted.

After the laser beam irradiation, a silicon grain 33 grows laterally from an interface 32 between the amorphous silicon region and the completely melted and liquidized silicon region and towards the irradiation region. The lateral growth of the grain 33 proceeds in a horizontal direction from the interface 32.

In the irradiated area corresponding to the transparent part of the mask, when the width of the transparent part 'A' of the laser beam pattern mask on the amorphous silicon layer 22 is half or less than half the growth length of the silicon grain, the grain growing inwards on both sides of the interface of the silicon region in a perpendicular direction comes into contact with one another at a mid-point 31, thereby causing the crystal growth to stop.

As described above, after the crystallizing process by a first irradiation, the number of crystallized regions formed in one block is the same as the number of transparent parts 'A' in the laser beam pattern mask (numeral 43 of FIG. 5).

Subsequently, in order to further grow the silicon grain, the stage having the substrate formed thereon is moved to perform another irradiation process on an area adjacent to the irradiated area of the first irradiation. Thus, another crystal is formed, with the new crystal being connected to the crystal formed after the first exposure. Similarly, crystals are formed on each side of the completely solidified regions. Generally, the crystal growth length produced by the laser irradiation process and connected to the irradiation part is in the range of 1.5 to 2 micrometers (μm).

Because the width of the laser beam and the size of the laser beam pattern mask are limited, the crystallization using the laser beam cannot be performed on the entire surface of the substrate 20 with a single irradiation. Therefore, as the size of the substrate becomes larger, the single laser beam pattern mask is moved a plurality of times, thereby performing the crystallization through a repetition of crystallizations in small areas.

When a small area is completely crystallized the beam pattern mask in this area is defined as one block. The crystallization within the one block is performed by a plurality of laser beam irradiations.

FIG. 4 illustrates a crystallized area of a portion of the amorphous silicon layer corresponding to the transparent part, after a first laser beam irradiation.

Referring to FIG. 4, a single shot of the laser beam is irradiated through the laser beam pattern mask (not shown) placed over the amorphous silicon layer 22. At this point, the irradiated laser beam passes through the plurality of transparent parts 'A' formed on the laser beam pattern mask. The laser beam then melts and liquidizes the amorphous silicon layer 22. The intensity of the laser energy used herein is a value selected from the complete melting region (as shown in FIG. 1), whereby the silicon layer is completely melted.

After the laser beam irradiation, the lateral growth of a silicon grain 33 proceeds from an interface 32 between the amorphous silicon region and the completely melted and liquidized silicon region towards the irradiation region. The lateral growth of the grain 33 proceeds in a horizontal direction from the interface 32.

In the irradiated area of the amorphous silicon layer 22 corresponding to the transparent parts of the mask, when the width of the transparent parts 'A' of the laser beam pattern mask is half or less than half the growth length of the silicon grain, the grain growing in a perpendicular direction inwards from both sides of the irradiated area from the interface of the silicon region comes into contact with a mid-point 31, thereby causing the crystal growth to stop.

After the crystallizing process of the first irradiation, the number of crystallized regions formed is the same as the number of transparent parts 'A' on the laser beam pattern mask (numeral 43 of FIG. 5).

In order to further grow the silicon grain, the stage having the substrate formed thereon is moved to perform another irradiation process on an area adjacent to the first irradiated area. Thus, another crystal is formed with the new crystal being connected to the crystal formed in the first irradiated area. Similarly, crystals are immediately formed on each side of the completely solidified regions. Generally, the crystal growth length produced by the laser irradiation process and connected to the irradiation part is in the range of 1.5 to 2 micrometers (μm).

By repeating the above-described process several times, a portion of the amorphous silicon layer corresponding to one block 'C', shown in FIG. 3, can be crystallized.

However, in the related art method for crystallizing silicon, the width of the transparent part 'A' of the laser beam pattern mask is smaller than that of the opaque part. Accordingly, in order to completely crystallize one block, the crystallizing process should be performed along with a plurality of small displacements of the stage.

FIG. 5 illustrates a schematic view of a related art sequential lateral solidification (SLS) device.

Referring to FIG. 5, the sequential lateral solidification (SLS) device includes a laser beam generator 41 generating laser beams, a focusing lens 42 focusing the laser beams discharged from the laser beam generator 41, a laser beam pattern mask 43 dividedly irradiating laser beam pulses on a substrate 50, and a reduction lens 44 formed below the laser beam pattern mask 43 and reducing the laser beam passing through the laser beam pattern mask 43 by a constant rate.

The laser beam generator 41 generally produces light with a wavelength of about 308 nanometers (nm) using XeCl or a wavelength of 248 nanometers (nm) using KrF in an excimer laser. The laser beam generator 41 discharges an untreated laser beam. The discharged laser beam passes through an attenuator (not shown), in which the energy level is controlled. The laser beam then passes through the focusing lens 42.

The substrate 50 having an amorphous silicon layer deposited thereon is fixed on an X-Y stage that faces the laser beam pattern mask 43.

In order to crystallize the entire surface of the substrate 50, the X-Y stage is minutely displaced, thereby gradually expanding the crystallized region.

The laser beam pattern mask 43 includes a transparent part 'A' allowing the laser beam to pass through, and an opaque region 'B' blocking the laser beam. The width of the transparent part 'A' determines the lateral growth length of the grains formed after the first exposure.

A focusing lens 42 controlling the intensity and size of the laser beam and the pattern, a laser beam pattern mask 43, and a reduction lens 44, which are shown below the laser generator 41, are collectively referred to as a projection lens 45.

FIG. 6 illustrates a schematic view showing reflection of the laser beam back towards the laser generator 41 during the crystallizing process using the related art sequential lateral solidification device.

Referring to FIG. 6, a portion of the laser beam irradiated to the substrate 50 is reflected back from the surface of the substrate 50 and into the projection lens 45 during the crystallization process. In this case, the laser beam irradiated to the projection lens 45 may then be reflected back from the surface of the lens, such as the focusing lens or the reduction lens, within the projection lens 45 towards the substrate 50.

The laser beam reflected back to the substrate 50 has a different path from that of the laser beam initially irradiated as the light source. So the reflected laser beam acts as a noise that may degrade the characteristics of the SLS device or result in a ghost effect causing poor crystallization characteristics.

FIG. 7 illustrates a schematic view showing an ablation occurring during the crystallizing process using the related art sequential lateral solidification device.

As shown in FIG. 7, when a crystallizing process is generally carried out using the SLS device, the energy density of the irradiated laser beam can be larger than the thin silicon layer deposited on the substrate 50 is able to withstand.

In this case, due to the laser beam irradiated onto the substrate 50, an ablation occurs on the thin silicon layer, whereby the solid silicon changes into a vapor. At this point, the vaporized silicon particles 51 art deposited on the surface of a lens (generally, the reduction lens) within the projection lens 45.

As the laser irradiation is repeated, the deposition of the particles 51 on the surface of the lens within the projection lens 45 increases, due to the ablation, thereby degrading the optical characteristics of the lens.

As described above, the related art SLS crystallizing method has the following disadvantages.

In order to perform the SLS crystallizing process on a silicon layer formed on a substrate, a fine laser beam having a line width of several micrometers (μm) should be formed. Accordingly, the SLS device should include a laser beam pattern mask, a focusing lens, and a reduction lens formed in the projection lens, so as to modify the pattern of the laser beam discharged from the laser generator.

In this case, when the laser beam passes through the projection lens to be irradiated onto the substrate, a portion of the laser beam is back reflected from the surface of the substrate and then is reflected back to the substrate by the projection lens. The reflected laser light acts as a noise in the region to be crystallized.

Furthermore, when irradiating the thin silicon layer formed on the substrate with the laser beam, the energy density of the irradiated laser beam can instantly become very high. When this happens, a portion of the thin silicon layer can be vaporized causing small particles to be deposited on the surface of the lens. With repetition the degradation of the lens increases, thereby causing a loss in the optical characteristic of the lens.

SUMMARY OF THE INVENTION

Accordingly, the present invention is directed to a sequential lateral solidification device that substantially obviates one or more problems due to limitations and disadvantages of the related art.

An advantage of the present invention is to provide a sequential lateral solidification device for improving optical characteristics of the device and preventing optical damage caused by ablation of the crystallization thin film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a sequential lateral solidification device includes a laser light source generating a laser beam, a projection lens focusing the laser beam generated from the laser light source onto a substrate, a laser beam splitter between the projection lens and the substrate that passes the laser beam generated from the laser light source to irradiate the substrate and that blocks the laser beam reflected back from the substrate towards the projection lens, and a stage having the substrate mounted thereon.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
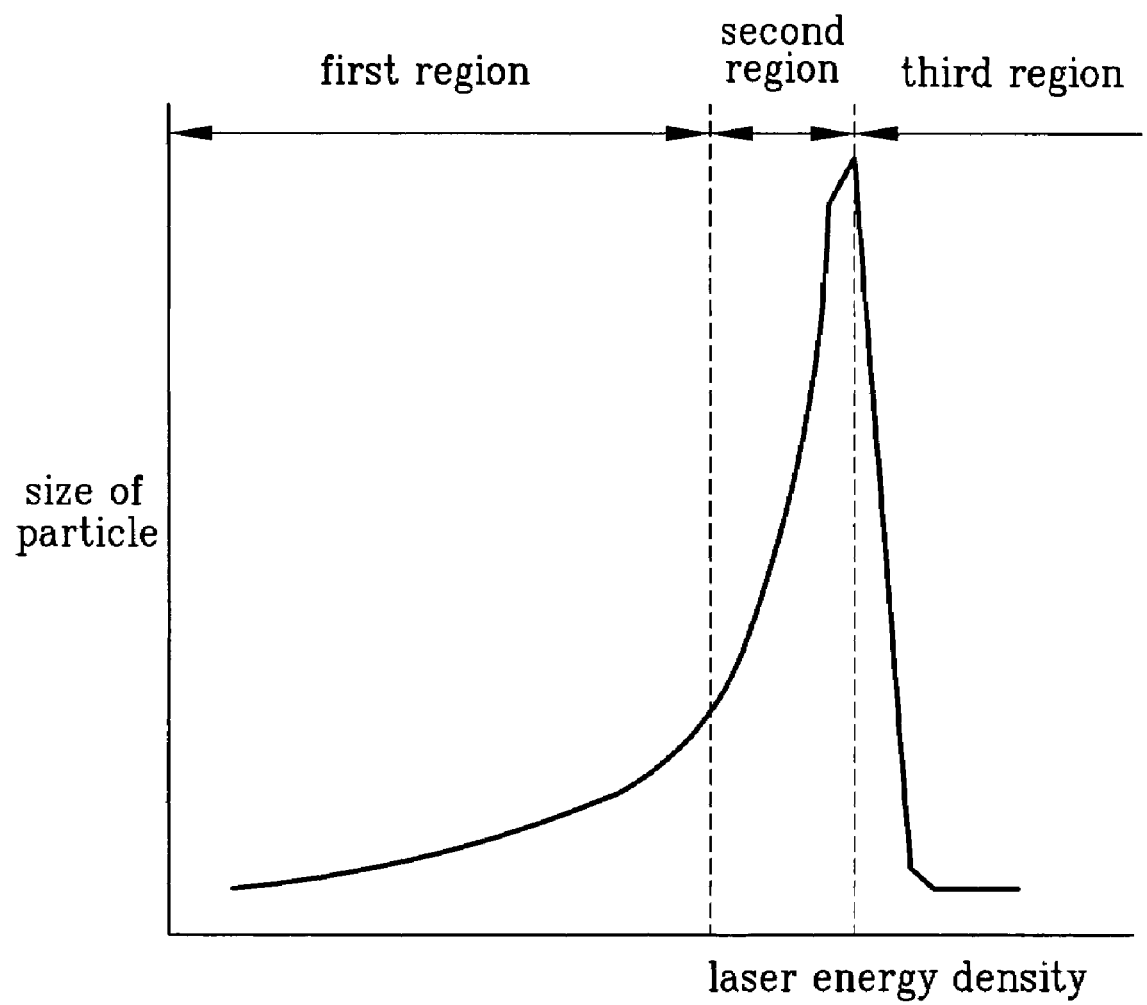
FIG. 1 illustrates a graph showing sizes of amorphous silicon particles by laser energy density.
Figure 2:
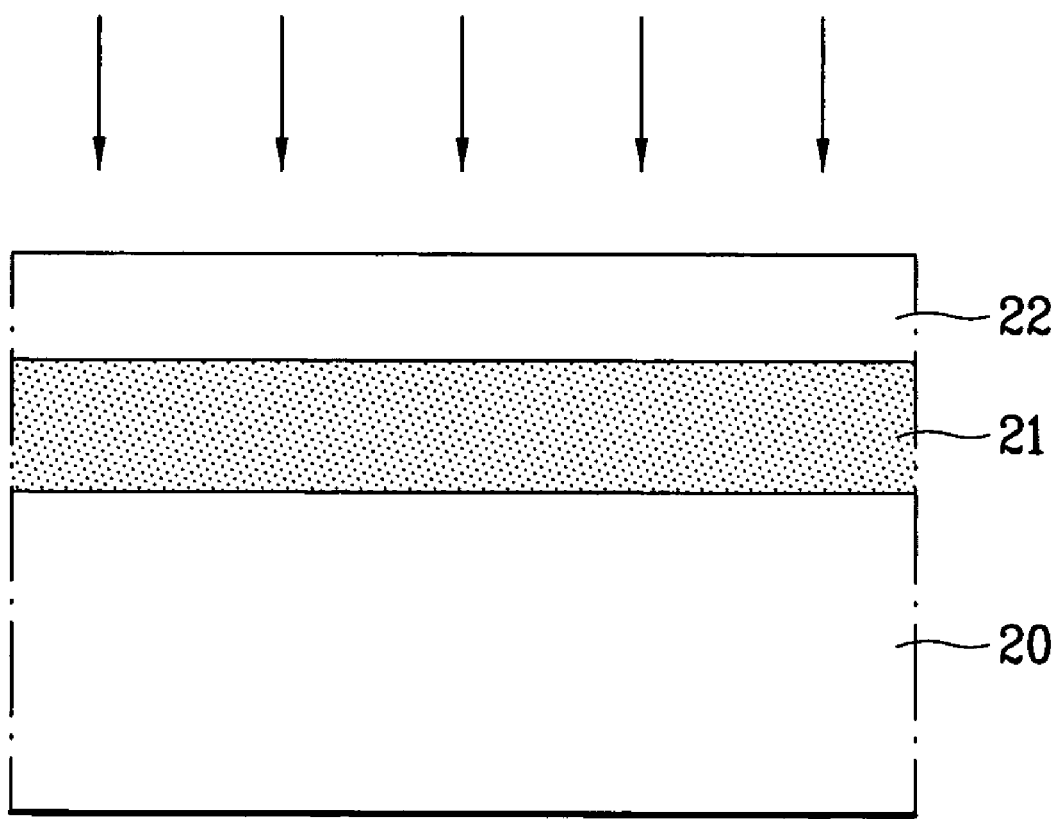
FIG. 2 illustrates a cross-sectional view showing a related art laser heat treatment process.
Figure 3:
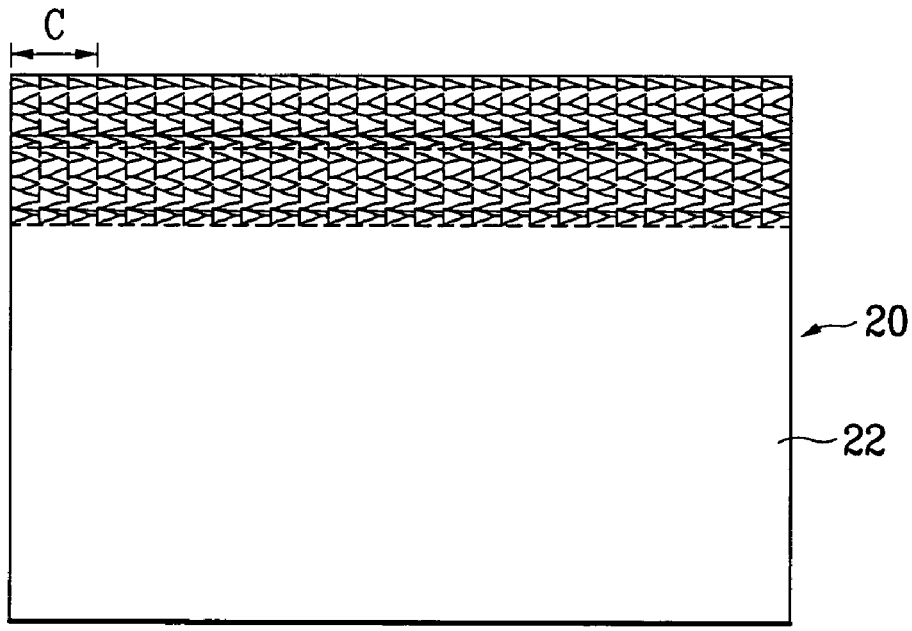
FIG. 3 illustrates a plane view of a substrate having a portion thereof crystallized.
Figure 4:
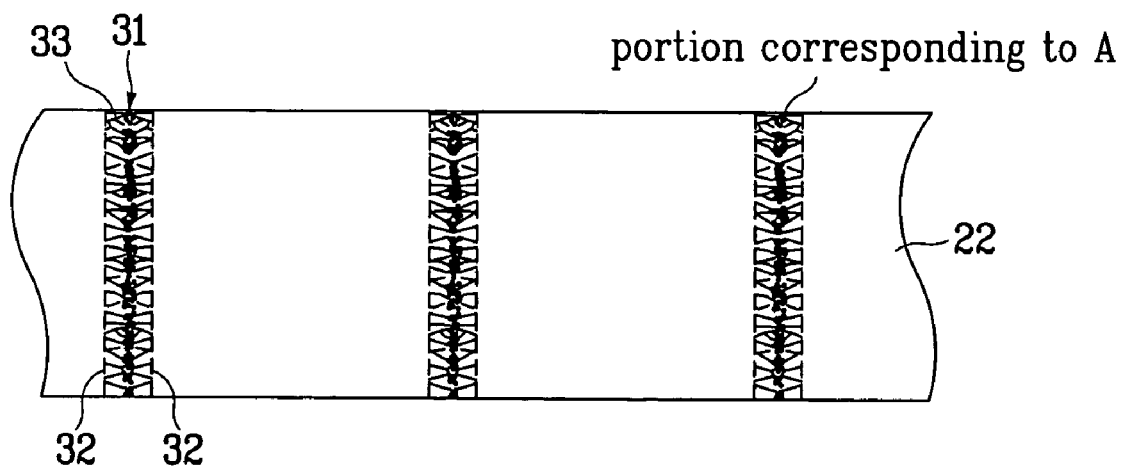
FIG. 4 illustrates a crystallized state of a portion of the amorphous silicon layer corresponding to a permeation part, after a first laser beam irradiation.
Figure 5:
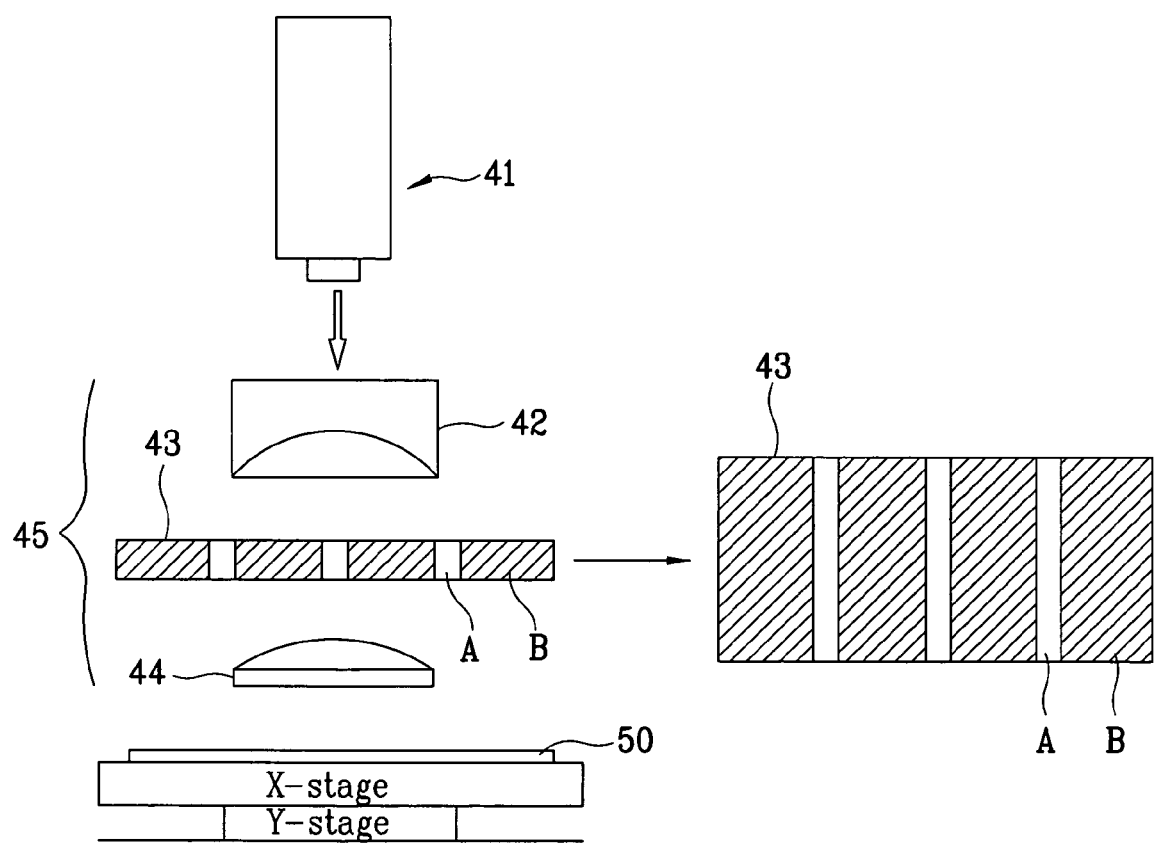
FIG. 5 illustrates a schematic view of a related art sequential lateral solidification device.
Figure 6:
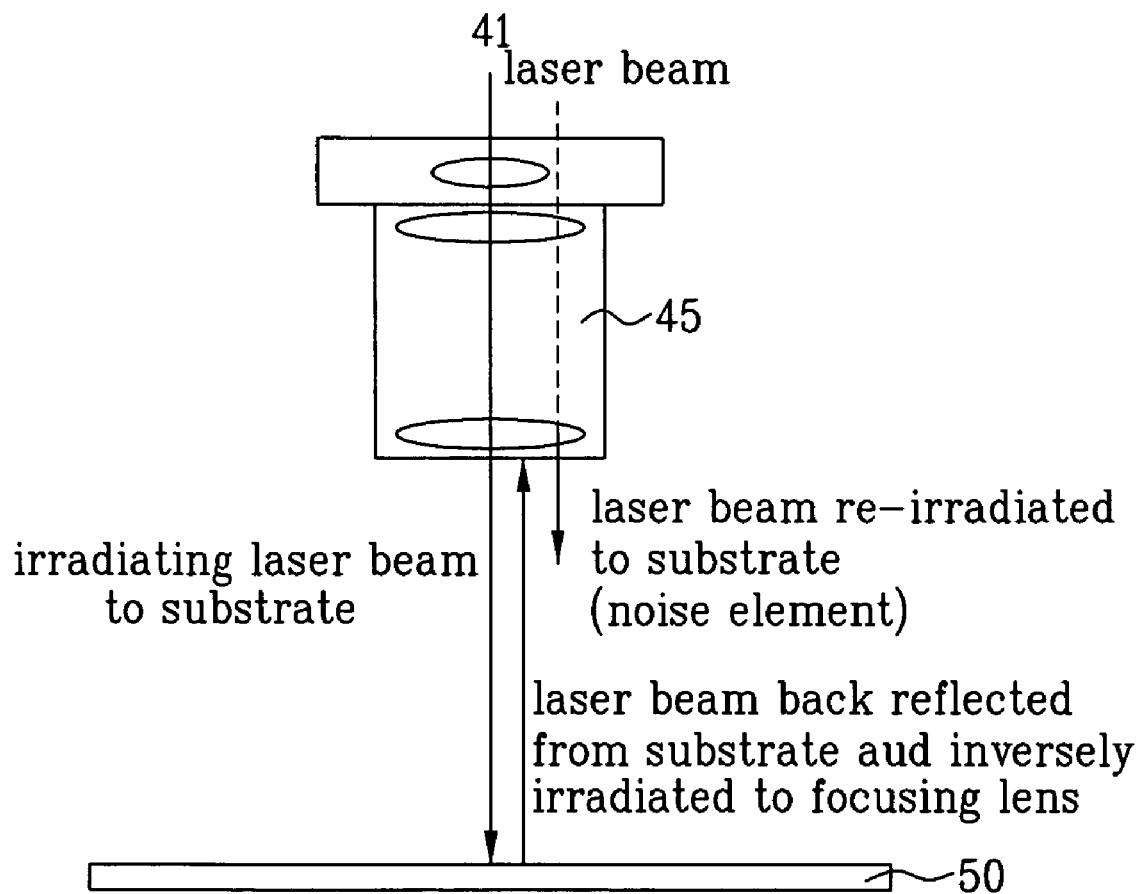
FIG. 6 illustrates a schematic view showing a back reflection occurring during a crystallizing process using the related art sequential lateral solidification device.
Figure 7:
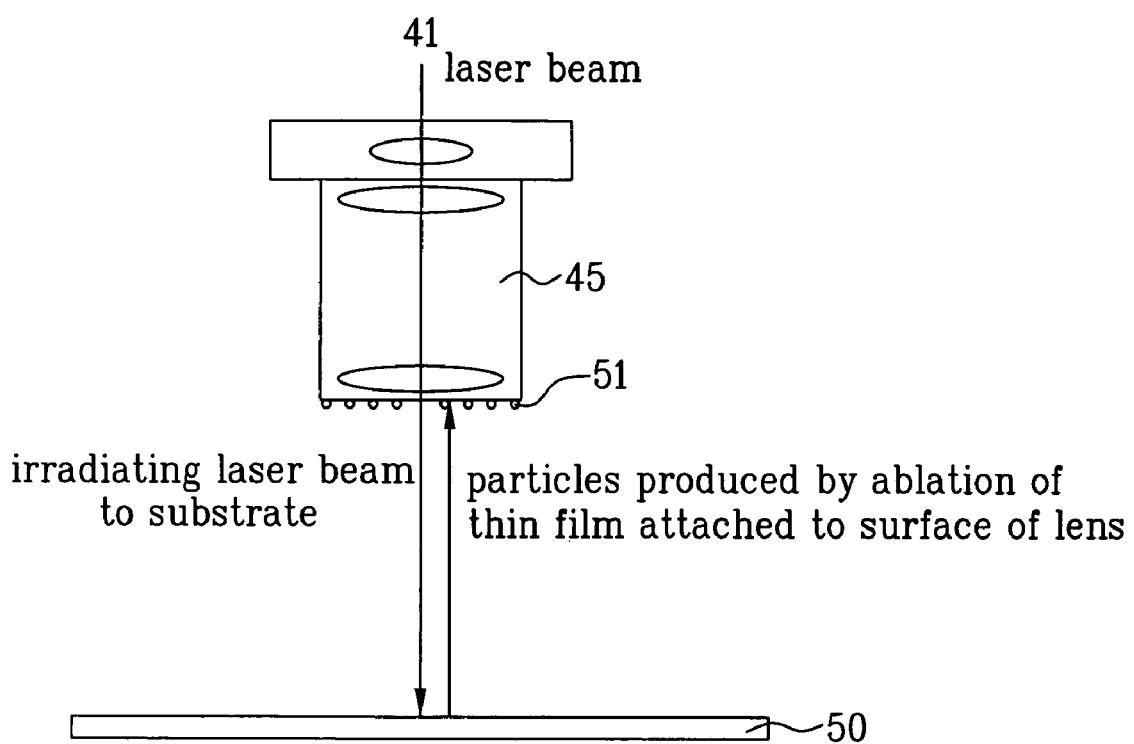
FIG. 7 illustrates a schematic view showing an ablation occurring during a crystallizing process using the related art sequential lateral solidification device.
Figure 8:
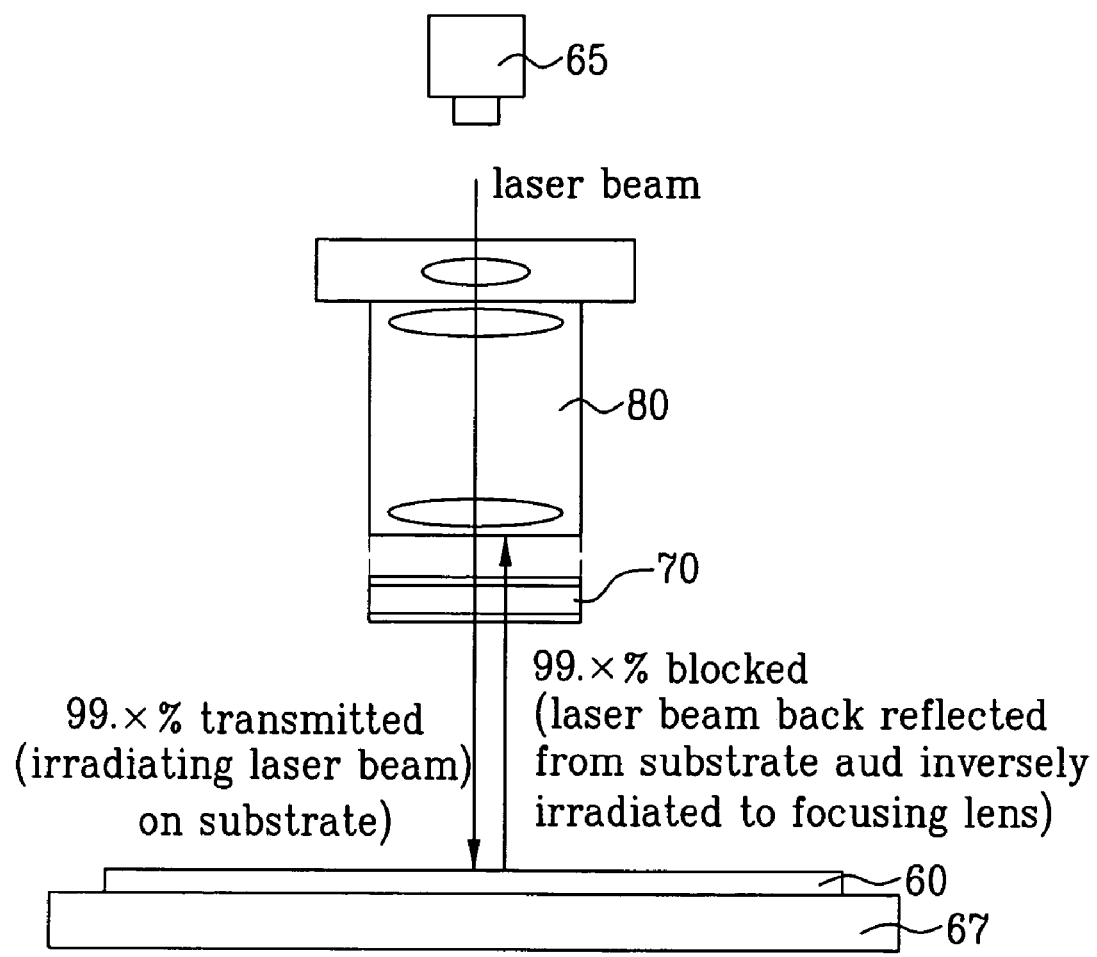
FIG. 8 illustrates a schematic view of a sequential lateral solidification device according to the present invention.

FIG. 8 illustrates a schematic view of a sequential lateral solidification device according to the present invention.

The sequential lateral solidification (SLS) device according to the present invention includes a substrate 60 having a thin silicon layer deposited thereon, a laser light source 65 generating laser beams, a projection lens 80 focusing the laser beam generated from the laser light source 65, changing the pattern of the laser beam, and irradiating the laser beam having the changed pattern on the substrate 60, a laser beam splitter 70 formed below the projection lens 80, transmitting the laser beam irradiated from the laser light source 65 to the substrate 60, and blocking the laser beam irradiated back to the projection lens 80 form the substrate 60, and a stage 67 mounted on the substrate 60.

Although not shown in the drawing, the projection lens 80 focuses the laser beam, changes the pattern of the laser beam, and irradiates the laser beam having the changed pattern to the substrate 60, the structure of which will now be described in detail.

The projection lens 80 includes a focusing lens focusing the laser beam discharged from the laser light source 65, a laser beam pattern mask dividing the laser beam and irradiating the divided laser beam to the substrate 60, and a reduction lens formed below the laser beam pattern mask that reduces the laser beam passing through the laser beam pattern mask at a constant rate.

The laser light source 65 generally produces light with a wavelength of 308 nanometers (nm) using XeCl or a wavelength of 248 nanometers (nm) using KrF in an excimer laser. The laser light source 65 discharges an untreated laser beam. The discharged laser beam passes through an attenuator (not shown), in which the level is controlled. The laser beam then passes through the focusing lens.

The substrate 60 having a thin amorphous silicon layer deposited thereon is fixed on the stage 67, that faces the laser beam pattern mask.

In order to crystallize the entire surface of the substrate 60, the stage 67 is minutely displaced, thereby gradually expanding the crystallized region.

Meanwhile, when the laser beam from the laser light source 65 passes through the projection lens 80 to be irradiated to the substrate 60, a portion of the irradiated laser beam is back reflected by the substrate 60 back towards the projection lens 80. The laser beam is then reflected back towards the substrate 60. However, the reflected laser beam acts as noise interfering with the crystallizing process on the substrate 60. Accordingly, the laser beam splitter 70 is provided below the projection lens 80 of the SLS device according to the present invention, so as to prevent the laser beam from being re-irradiated.

The laser beam splitter 70 transmits the laser beam irradiated from the laser light source 65 to the substrate 60. However, the laser beam splitter 70 blocks the laser beam reflected from the substrate 60 and prevents this reflected laser beam from reflecting back toward the substrate. Therefore, the crystallizing process may be performed without the problem of the reflected laser beam from the substrate 60 to the projection lens 80, thereby allowing the production of a desired crystalline pattern without any noise element.

Herein, the transmissivity of the laser beam splitter 70 is about 99%. The element of the laser beam being transmitted to the laser beam splitter 70, which is then reflected should be approximately 1%.

In addition, the laser beam splitter 70 also prevents ablation from occurring on the thin silicon layer formed on the substrate 60, which is caused by an abrupt increase in the laser energy density. Thus, damage caused on the surface of the lens within the projection lens 80 may be prevented.

In this case, vaporized silicon particles may be deposited on the surface of the laser beam splitter 70 due to the ablation. When silicon particles are excessively deposited on the surface of the laser beam splitter 70, so as to cause damage, the damaged laser beam splitter 70 can be replaced.

Generally, the focusing lens or the reduction lens provided in the projection lens 80 are very expensive as compared to the laser beam splitter 70, thereby resulting in increased device cost when replacement is required. The present invention is advantageous in that by using the laser beam splitter 70 as a primary protective layer against the ablation of the thin silicon layer, a unit providing optimum optical efficiency may be replaced at a relatively low cost, thereby reducing the overall product cost.

Meanwhile, the laser beam splitter 70 may be controlled to be inclined at both ends. The inclination of the laser beam splitter 70 is determined by the region of the substrate where the laser beam is to be irradiated and by the intensity of the laser beam required during the irradiation.

Figure 9:
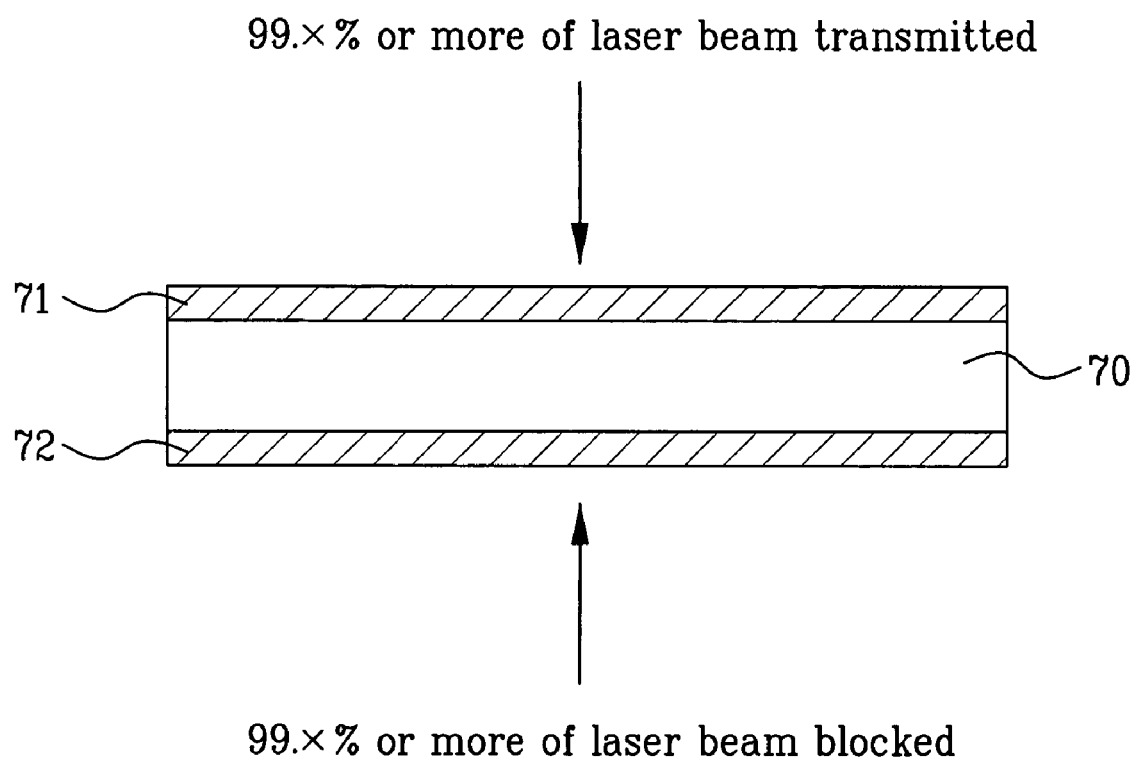
FIG. 9 illustrates a laser beam splitter of the sequential lateral solidification device according to the present invention of FIG. 8.

FIG. 9 illustrates a laser beam splitter of the sequential lateral solidification device according to the present invention of FIG. 8. The laser beam splitter 70 may include an anti-reflection layer 71 and 72 on both the upper and lower surfaces thereof.

Each of the anti-reflection layers 71 and 72 blocks a reflective element of the laser beam being transmitted to the laser beam splitter 70, so as to provide a specific direction to the laser beam.

In addition, the anti-reflection layers 71 and 72 act as a protective layer protecting the laser beam splitter 70 when an ablation occurs. Accordingly, the optical efficiency of the SLS device can be recovered by simply replacing the anti-reflection layers 71 and 72 without having to replace the laser beam splitter 70.

The sequential lateral solidification device according to the present invention has the following advantages.

A laser beam splitter is mounted below the projection lens, so as to provide a specific direction to the laser beam irradiated to the substrate from the laser light source and to eliminate back reflections, thereby preventing noise from occurring due to reflections of the laser beam.

In addition, the laser beam splitter may act as a primary protective layer protecting the projection lens from ablation of the thin silicon layer, which is caused by the vaporization of the thin silicon layer due to an abrupt increase in the energy density when the laser beam is irradiated.

Moreover, damage caused to the lens within the expensive projection lens may be prevented, thereby reducing overall product cost.

Finally, by preventing the damage caused in the lens within the projection lens, the optical characteristics of the sequential lateral solidification device may be maintained and the durability of the device may be extended.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A sequential lateral solidification device, comprising:
   a laser light source generating a laser beam;
   a projection lens focusing the laser beam generated from the laser light source onto a substrate;
   a laser beam splitter having a replaceable anti-reflection layer between the projection lens and the substrate that passes more than about 99% of the laser beam generated from the laser light source to irradiate the substrate and that blocks more than about 99% of the laser beam reflected back from the substrate towards the projection lens; and
   a stage having the substrate mounted thereon.

2. The device according to claim 1, wherein the projection lens includes:
   a focusing lens focusing the laser beam;
   a laser beam pattern mask that shapes the laser beam; and
   a reduction lens reducing the focused and patterned laser beam.

3. The device according to claim 1, wherein an upper surface and a lower surface of the laser beam splitter include the anti-reflection layers.

4. The device according to claim 1, wherein the laser beam splitter has an inclination at both ends.

5. The device according to claim 4, wherein the inclination at both ends is controlled depending upon an irradiation region and a required laser beam intensity.

\* \* \* \* \*